(12) United States Patent
Baek et al.

(10) Patent No.: US 12,378,655 B2
(45) Date of Patent: Aug. 5, 2025

(54) MASK, MASK ASSEMBLY, AND APPARATUS FOR MANUFACTURING DISPLAY APPARATUS

(71) Applicant: Samsung Display Co., Ltd., Yongin-si (KR)

(72) Inventors: Daewon Baek, Yongin-si (KR); Minji Jang, Yongin-si (KR); Jongbum Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/407,349

(22) Filed: Jan. 8, 2024

(65) Prior Publication Data

US 2024/0164197 A1     May 16, 2024

Related U.S. Application Data

(62) Division of application No. 17/661,031, filed on Apr. 27, 2022, now Pat. No. 11,871,644.

(30) Foreign Application Priority Data

May 25, 2021     (KR) .................. 10-2021-0066828

(51) Int. Cl.
  *H10K 71/00*     (2023.01)
  *B05C 21/00*     (2006.01)
  *C23C 14/04*     (2006.01)
  *H10K 59/88*     (2023.01)

(52) U.S. Cl.
  CPC .......... *C23C 14/042* (2013.01); *B05C 21/005* (2013.01); *H10K 71/00* (2023.02); *H10K 59/88* (2023.02)

(58) Field of Classification Search
  None
  See application file for complete search history.

(56) References Cited

U.S. PATENT DOCUMENTS

| | | |
|---|---|---|
| 8,604,489 B2 | 12/2013 | Hong et al. |
| 8,757,088 B2 | 6/2014 | Lee et al. |
| 10,053,766 B2 | 8/2018 | Kim |
| 10,083,997 B2 | 9/2018 | Kim |
| 10,439,170 B2 | 10/2019 | Lin |
| 2003/0101932 A1 | 6/2003 | Kang |
| 2011/0171768 A1 | 7/2011 | Hong et al. |
| 2011/0265714 A1 | 11/2011 | Lee et al. |
| 2018/0216220 A1 | 8/2018 | Lv et al. |
| 2019/0019994 A1 | 1/2019 | Lin |
| 2021/0019459 A1 | 1/2021 | Liu et al. |
| 2021/0187576 A1 | 6/2021 | Wu et al. |
| 2022/0384769 A1* | 12/2022 | Baek ............... H10K 71/00 |

FOREIGN PATENT DOCUMENTS

| | | |
|---|---|---|
| KR | 10-2011-0120700 A | 11/2011 |
| KR | 10-2016-0054114 A | 5/2016 |
| KR | 10-2017-0102143 A | 9/2017 |
| KR | 10-2020-0131788 A | 11/2020 |

* cited by examiner

*Primary Examiner* — Jethro M. Pence
(74) *Attorney, Agent, or Firm* — Womble Bond Dickinson (US) LLP

(57) ABSTRACT

A mask including: a deposition pattern portion including a plurality of deposition holes that are configured to have deposition material pass therethrough; and a dummy pattern portion outside the deposition pattern portion, wherein the dummy pattern portion includes an auxetic structure having a negative Poisson's ratio.

4 Claims, 13 Drawing Sheets

MASK, MASK ASSEMBLY, AND APPARATUS FOR MANUFACTURING DISPLAY APPARATUS

CROSS-REFERENCE TO RELATED APPLICATIONS

This application is a divisional of U.S. patent application Ser. No. 17/661,031, filed Apr. 27, 2022, which claims priority to and the benefit of Korean Patent Application No. 10-2021-0066828, filed May 25, 2021, the entire content of both of which is incorporated herein by reference.

BACKGROUND

1. Field

Aspects of one or more embodiments relate to a mask, a mask assembly, and an apparatus for manufacturing a display apparatus.

2. Description of the Related Art

With the development of an information-oriented society, demand for display apparatuses for displaying images has increased in various forms. The field of display apparatuses has rapidly changed into thin and lightweight flat-panel display apparatuses that may have a large size, replacing cathode ray tubes having a comparatively large volume or size. Flat-panel display apparatuses include, for example, liquid crystal display apparatuses, plasma display panels, organic light-emitting display apparatuses, and electrophoretic display apparatuses.

Organic light-emitting display apparatuses among display apparatuses include organic light-emitting diodes (OLEDs) each including a pixel electrode, an opposite electrode, and an emission layer. In this case, the electrodes and the emission layers may be formed by various methods. One of the methods includes independent deposition. In independent deposition, a fine metal mask (FMM) is stretched in a lengthwise direction thereof and closely attached to a mask frame, and deposition materials passing through the mask are deposited on an object deposition surface. A mask is accurately aligned and closely attached to a mask frame may enable more precise deposition.

The above information disclosed in this Background section is only for enhancement of understanding of the background and therefore the information discussed in this Background section does not necessarily constitute prior art.

SUMMARY

Aspects of one or more embodiments relate to a mask, a mask assembly, and an apparatus for manufacturing a display apparatus, and for example, to a mask for deposition, a mask assembly including the mask, and an apparatus for manufacturing a display apparatus.

However, because a mask has a very thin thickness compared to a length thereof and/or a width thereof, curls and wrinkles may be formed on the mask according to internal stress while the mask is stretched. The curls formed on the mask may hinder the mask from being accurately aligned and attached to the mask frame. In addition, wrinkles formed on the mask may hinder the mask from closely contacting the mask frame.

One or more embodiments include a mask, a mask assembly, and an apparatus for manufacturing a display apparatus, in which forming of curls and wrinkles on the mask may be reduced. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a mask includes a deposition pattern portion including a plurality of deposition holes that are configured to have deposition material pass therethrough, and a dummy pattern portion outside the deposition pattern portion, wherein the dummy pattern portion includes an auxetic structure having a negative Poisson's ratio.

According to some embodiments, the dummy pattern portion may include a plurality of dummy holes having shapes different from those of the plurality of deposition holes of the deposition pattern portion in a plan view.

According to some embodiments, the deposition pattern portion may include a first deposition hole and a second deposition hole having different planar shapes from each other, and the second deposition hole may be adjacent to one of the plurality of dummy holes of the dummy pattern portion.

According to some embodiments, the second deposition hole may have a shape corresponding to a shape of one of the plurality of dummy holes such that a width between the second deposition hole and the one of the plurality of dummy holes is constant in a plan view.

According to some embodiments, the dummy pattern portion may surround the deposition pattern portion entirely in a plan view.

According to some embodiments, the dummy pattern portion may surround the deposition pattern portion partially in a plan view.

According to some embodiments, the deposition pattern portion may be provided in plurality, and the dummy pattern portion may be between the deposition pattern portions that are adjacent to each other in a plan view.

According to some embodiments, the dummy pattern portion may be between an end crossing a longitudinal direction of the mask and the deposition pattern portion in a plan view.

According to one or more embodiments, a mask assembly includes a mask frame including an opening, and a mask on the mask frame and a dummy pattern portion, wherein the deposition pattern portion overlaps the opening and the dummy pattern portion is outside the deposition pattern portion, wherein the dummy pattern portion includes an auxetic structure having a negative Poisson's ratio.

According to some embodiments, the dummy pattern portion may include a plurality of dummy holes having shapes different from those of the plurality of deposition holes of the deposition pattern portion in a plan view.

According to some embodiments, the deposition pattern portion may include a first deposition hole and a second deposition hole having different planar shapes from each other, and the second deposition hole may be adjacent to one of the plurality of dummy holes of the dummy pattern portion.

According to some embodiments, the second deposition hole may have a shape corresponding to a shape of one of the plurality of dummy holes such that a width between the second deposition hole and the one of the plurality of dummy holes is constant in a plan view.

According to some embodiments, the dummy pattern portion may surround the deposition pattern portion entirely in a plan view.

According to some embodiments, the dummy pattern portion may surround the deposition pattern portion partially in a plan view.

According to some embodiments, the deposition pattern portion may be provided in plurality in a first direction, and the dummy pattern portion may be between two adjacent deposition pattern portions from among the plurality of deposition pattern portions.

According to one or more embodiments, an apparatus for manufacturing a display apparatus includes a chamber in which a display substrate is arranged, a deposition source inside the chamber and configured to supply a deposition material into the chamber, and a mask assembly between the display substrate and the deposition source and configured to have the deposition material pass therethrough, wherein the mask assembly includes a mask frame including an opening, and a mask arranged on the mask frame and including a deposition pattern portion and a dummy pattern portion, wherein the deposition pattern portion overlaps the opening and the dummy pattern portion is outside the deposition pattern portion, and wherein the dummy pattern portion includes an auxetic structure having a negative Poisson's ratio.

According to some embodiments, the deposition pattern portion may include a first deposition hole and a second deposition hole having different planar shapes from each other, and the dummy pattern portion may include a dummy hole having a planar shape different from those of the first deposition hole and the second deposition hole.

According to some embodiments, the second deposition hole may be adjacent to the dummy hole and may have a shape corresponding to a shape of the dummy hole such that a width between the second deposition hole and the dummy hole is constant in a plan view.

According to some embodiments, the dummy pattern portion may surround the deposition pattern portion entirely in a plan view.

According to some embodiments, the deposition pattern portion may be provided in plurality and the dummy pattern portion may be arranged between the plurality of deposition pattern portions that are adjacent to each other in a plan view.

These and/or other aspects will become apparent and more readily appreciated from the following description of the embodiments, the accompanying drawings, and claims and their equivalents.

These general and specific aspects may be implemented by using a system, a method, a computer program, or a combination of a certain system, method, and computer program.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
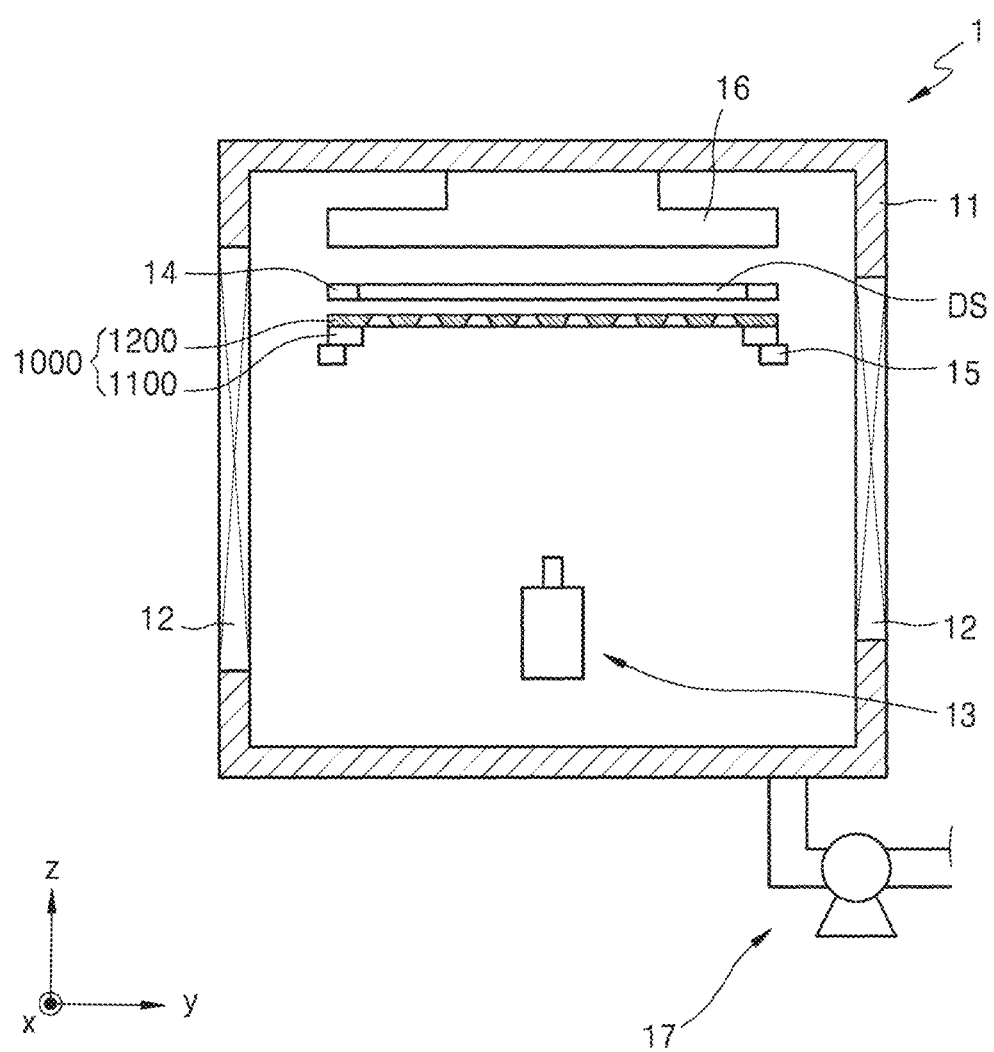
FIG. 1 is a cross-sectional view of an apparatus for manufacturing a display apparatus, according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a cross-sectional view of an apparatus for manufacturing a display apparatus according to some embodiments.

Referring to FIG. 1, an apparatus 1 for manufacturing a display apparatus may include a chamber 11, an opening/closing portion 12, a deposition source 13, a first support 14, a second support 15, a magnetic force generator 16, a pressure adjustor 17, a display substrate DS, and a mask assembly 1000.

The chamber 11 may include an inner space (e.g., a cavity or open area) therein, and the display substrate DS may be arranged inside the chamber 11. The inner space of the chamber 11 may be a work space for performing a deposition process (e.g., for depositing material onto the display substrate DS). In this case, the display substrate DS may be a portion of a display apparatus 2 that is in a process of manufacturing the display apparatus described in more detail below with reference to FIG. 11.

An opening (or multiple openings) through which the display substrate DS may pass may be arranged at one side of the chamber 11. That is, the display substrate DS may be inserted into or carried out (e.g., removed) from the inner space of the chamber 11 through the opening of the chamber 11. In this case, an opening/closing portion 12 may be arranged in the opening of the chamber 11, the opening/closing portion 12 including a gate valve and the like. Accordingly, the opening may be selectively opened according to the operations of the manufacturing process.

The deposition source 13 may be arranged inside the chamber 11. The deposition source 13 may receive deposition material and supply the deposition material to the inner space of the chamber 11. Here, the deposition material may include materials forming one or more pattern layers (e.g., an organic pattern layer) (e.g., a preset or predetermined pattern layer having a preset or predetermined shape or pattern) on the display substrate DS. The deposition source 13 may apply energy (e.g., heat energy, light energy, vibration energy, and the like) to the deposition material to evaporate or sublimate the deposition material. According to some embodiments, the deposition source 13 may include a heater therein. The deposition source 13 may melt or sublimate the deposition material by heating the deposition material inside the deposition source 13 through an operation of the heater. The deposition source 13 may be replaceable. In this case, when the deposition material received in the deposition source 13 is exhausted, the deposition source 13 may be replaced by a new deposition source.

The first support 14 may support the display substrate DS. In this case, the first support 14 may seat the display substrate DS thereon and support the display substrate DS, attach to or adsorb one side of the display substrate DS to support the display substrate DS. As an example, the first support 14 may include a frame, a bar and the like connected to the inside of the chamber 11. As another example, the first support 114 may include a clamp gripping the display substrate DS. As another example, the first support 114 may include an adhesive chuck or an electrostatic chuck. In this case, the first support 14 may be formed as one body with the magnetic force generator 16. The first support 14 may adjust the position of the display substrate DS. As an example, the first support 14 may include a UVW stage.

The second support 15 may support the mask assembly 1000. In this case, because the second support 15 may be the same as or similar to the first support 14, detailed descriptions thereof are omitted for convenience of description. In addition, the case where the second support 15 includes a frame connected to the inside of chamber 11 and the mask assembly 1000 is seated and supported on the frame is mainly described below in detail.

At least one of the first support 14 or the second support 15 may be raised and/or lowered inside the chamber 11. In this case, at least one of the first support 14 or the second support 15 may adjust an interval between the display substrate DS and the mask assembly 1000.

The magnetic force generator 16 may be arranged in the chamber 11 to closely attach the mask assembly 1000 to the display substrate DS. In this case, the magnetic force generator 16 may include an electromagnet or a permanent magnet and the like that generates magnetic force.

The pressure adjuster 17 may be connected to the chamber 11 to adjust the inner pressure of the chamber 11. In this case, the pressure adjuster 17 may include a pipe and a pump, the pipe being connected to the chamber 11 and the pump being arranged on the pipe.

According to some embodiments, the apparatus 1 for manufacturing a display apparatus may include a vision portion. The vision portion may be arranged inside or outside the chamber 11 to photograph the positions of the mask assembly 1000 and the display substrate DS. In this case, the vision portion may photograph an alignment mark and the like of at least one of the mask assembly 1000 or the display substrate DS.

The mask assembly 1000 may be arranged between the display substrate DS and the deposition source 13. The mask assembly 1000 may include a mask frame 1100 and a mask 1200. The mask 1200 may be fixed to the mask frame 1100 while being stretched in one direction. The mask 1200 may include at least one pattern hole.

An operation of the apparatus 1 for manufacturing a display apparatus is described. While the pressure adjustor 17 maintains the inner pressure of the chamber 11 that is the same as or similar to the atmospheric pressure, the opening/closing portion 12 is opened and the display substrate DS and the mask assembly 1000 may be inserted into the chamber 11. In this case, at least one of the display substrate DS or the mask assembly 1000 may be moved through a separate robot arm arranged outside the chamber 11 or a shuttle and the like inserted into or carried out from the chamber 11.

Each of the display substrate DS and the mask assembly 1000 is arranged on the first support 14 and the second support 15, and then the positions of the display substrate DS and the mask assembly 1000 may be sensed through the vision portion and thus the display substrate DS and the mask assembly 1000 may be aligned. Then, the display substrate DS and the mask assembly 1000 are brought close to each other, and then display substrate DS may be closely attached to the mask assembly 1000 through the magnetic force generator 16.

When the deposition material is emitted from the deposition source 13, the deposition material may pass through the holes of the mask 1200 of the mask assembly 1000 and be deposited on the display substrate DS. Through this, a preset or predetermined pattern may be formed on the display substrate DS. As an example, the deposition material deposited on the display substrate DS may form an organic layer such as an emission layer 222 (see FIG. 12) described below.

When the above operation is completed, the display substrate DS may be carried out to the outside of the chamber 11 or moved to another place in the chamber and another layer may be formed on the display substrate DS.

Figure 2:
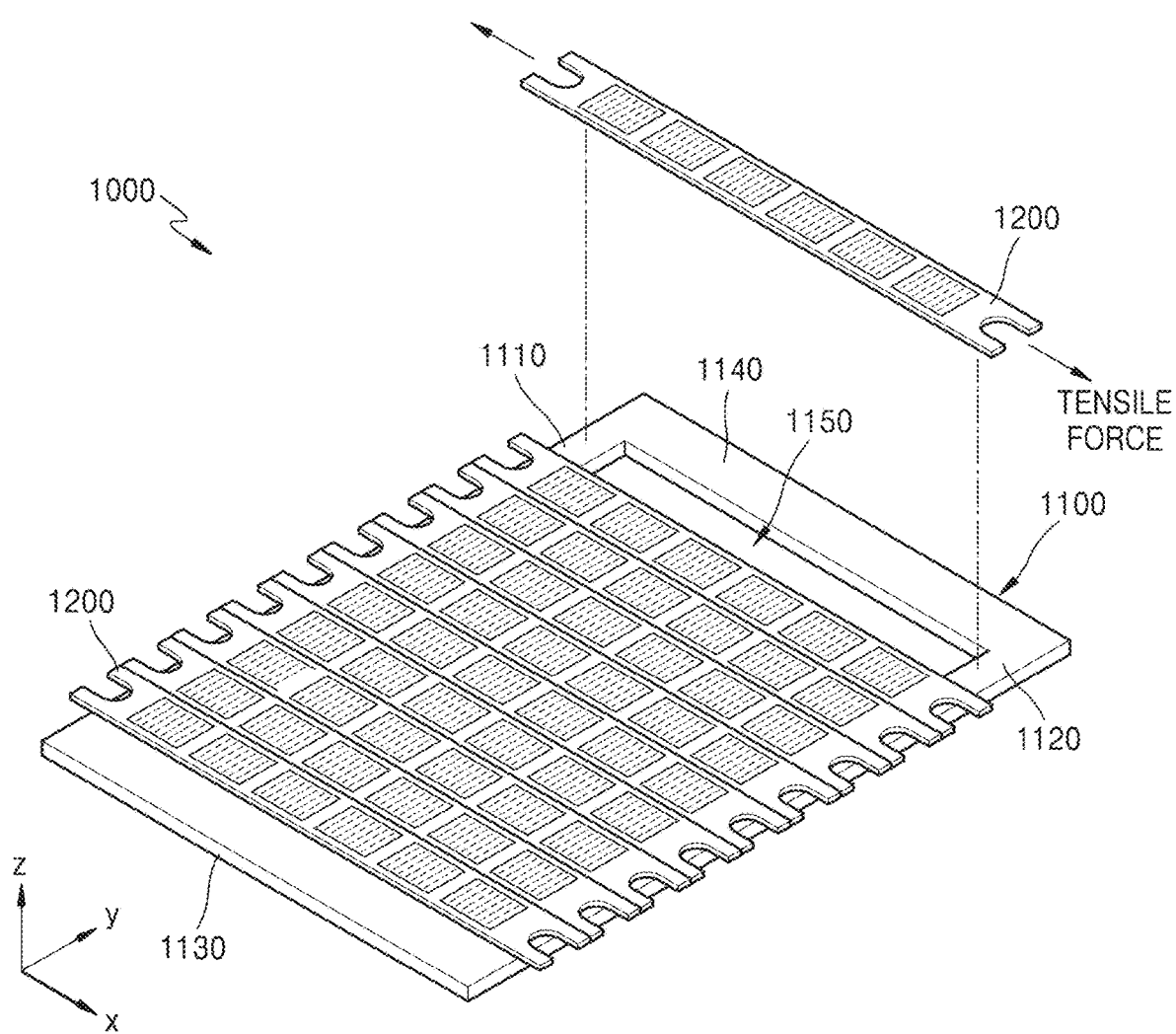
FIG. 2 is a perspective view of a mask assembly according to some embodiments.
Figure 3:
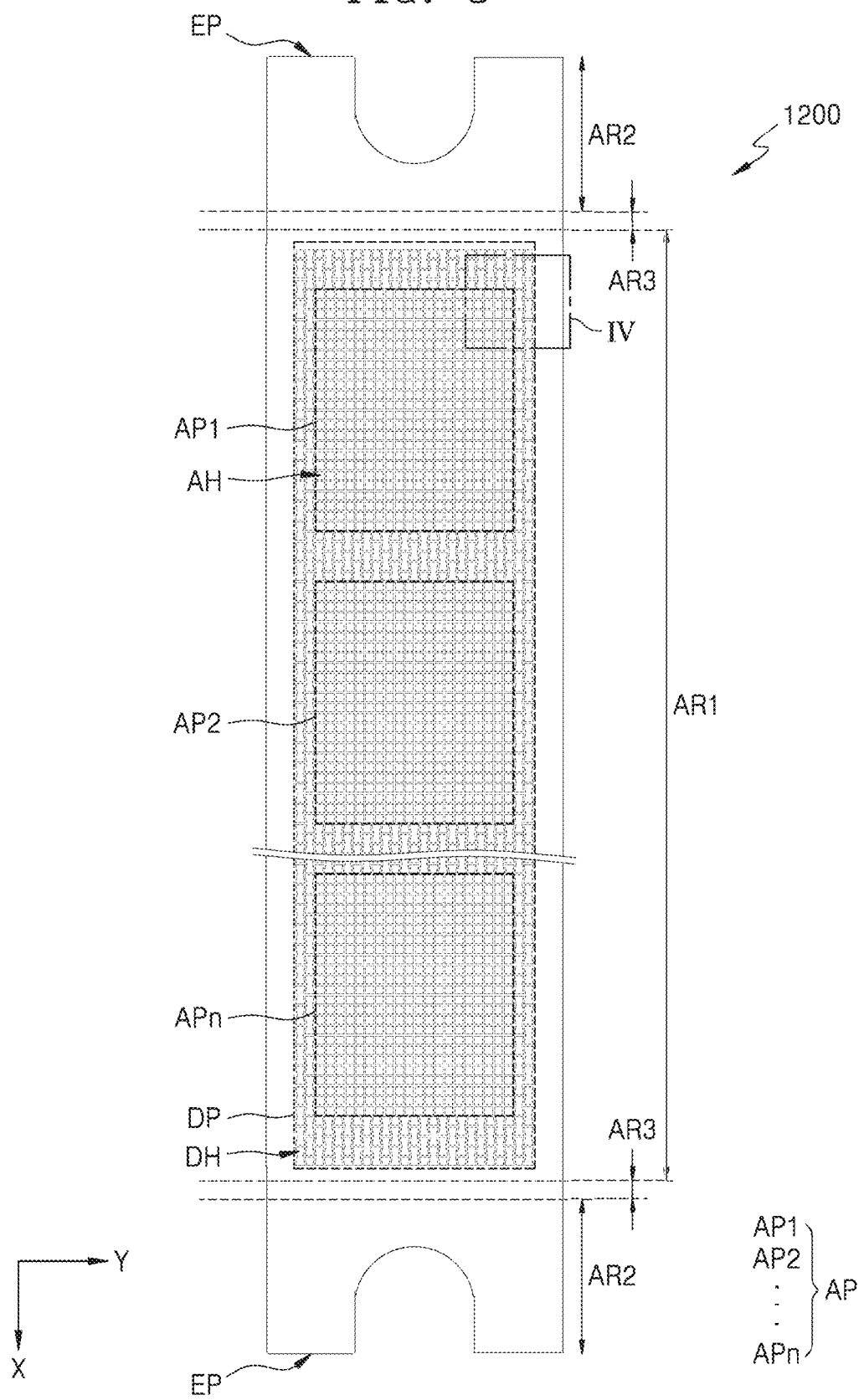
FIG. 3 is a plan view of a mask according to some embodiments.

FIG. 2 is a perspective view of the mask assembly 1000 according to some embodiments, and FIG. 3 is a plan view of the mask 1200 according to some embodiments.

Referring to FIGS. 2 and 3, the mask assembly 1000 may include the mask frame 1100 and the mask 1200 on the mask frame 1100.

The mask frame 1100 may include an opening 1150 through which the deposition material may pass and include a plurality of sub-frames forming the opening 1150.

According to some embodiments, the mask frame 1100 may include a first sub-frame 1110 and a second sub-frame 1120 facing each other, and a third sub-frame 1130 and a fourth sub-frame 1140 facing each other. As an example, the first sub-frame 1110 may be apart from the second sub-frame 1120 in an x-direction, which is a longitudinal direction of the mask 1200, and may extend in a y-direction, which is a direction (that is, a transversal direction) crossing the longitudinal direction of the mask 1200. The third sub-frame 1130 may be apart from the fourth sub-frame 1140 in the y-direction and may extend in the x-direction. The first sub-frame 1110 may be connected to the third sub-frame 1130 and the fourth sub-frame 1140, and the second sub-frame 1120 may be connected to the third sub-frame 1130 and the fourth sub-frame 1140.

Like this, as shown in FIG. 2, though the mask frame 1100 may have a quadrangular shape in a plan view (e.g., a view perpendicular or normal with respect to a plane parallel to the upper surface of the mask frame 1100), the embodiments are not limited thereto. As an example, the mask frame 1100 may have various shapes such as a polygon including a triangle, a pentagon and the like, a circular shape, an elliptical shape and the like. In addition, as an example, the opening 1150 of the mask frame 1100 may have a quadrangular shape in a plan view. As another example, the opening 1150 may have various shapes such as a polygon including a triangle, a pentagon and the like, a circular shape, an elliptical shape and the like.

The mask frame 1100 may have a very thin thickness compared to a horizontal length thereof or a vertical length thereof. When the thickness is too thick, the deposition material may be hindered from passing through the mask 1200 during a deposition process that uses the mask assembly 1000. In contrast, when the thickness is too thin, it may be difficult to secure the rigidity for supporting the mask 1200. That is, the mask frame 1100 may sag or the shape may be distorted during the manufacturing process. Accordingly, the mask frame 1100 may have an appropriate thickness considering the above aspects.

In addition, the mask frame 1100 may include, for example, metal. As an example, the mask frame 1100 may include metal that is not transformed much against welding.

According to some embodiments, the mask frame 1100 may include a support stick. The support stick may overlap a region that excludes a deposition pattern portion AP (see FIG. 3) of the mask 1200. The support stick may extend, for example, in the y-direction and be connected to the third sub-frame 1130 and/or the fourth sub-frame 1140. The support stick may block the deposition material in a partial region (e.g., a region smaller than the entirety of the area of the mask 1200) such that the deposition material is deposited in only a region set or determined in advance. In addition, the support stick may prevent or reduce a warping phenomenon due to weight of the mask 1200 and support the mask frame 1100.

The mask frame 1100 may support the mask 1200. According to some embodiments, the mask 1200 may be fixed on the mask frame 1100 while being stretched in the longitudinal direction, that is, the x-direction.

The mask 1200 may include, for example, stainless steel, invar, nickel (Ni), cobalt (Co), a nickel alloy, a nickel-cobalt alloy and the like. Because these materials have a low thermal expansion coefficient, the transformation of a mask frame MF due to heat may be reduced during a process of manufacturing the mask assembly 1000.

According to some embodiments, the width of the mask 1200 may be less than the width of the opening 1150. As an example, as shown in FIG. 2, the width of the mask 1200 in the y-direction may be less than the width of the opening 1150 in the y-direction. The mask 1200 may be provided in a plurality. The plurality of masks 1200 may be successively arranged between the third sub-frame 1130 and the fourth sub-frame 1140. Each mask 1200 may be fixed to the first sub-frame 1110 and the second sub-frame 1120 through welding. The plurality of masks 1200 may cover the opening 1150 of the mask frame 1100.

Referring to FIG. 3, according to some embodiments, the mask 1200 may include a first region AR1, a second region AR2, and a third region AR3 arranged in the longitudinal direction (that is, a ±x-direction) of the mask 1200. The first region AR1 may be arranged in the center of the mask 1200 and be a region that overlaps the opening 1150 of the mask frame 1100.

The second region AR2 may be arranged in two opposite end portions EP in the longitudinal direction of the mask 1200. The second region AR2 may be a region gripped by, for example, a clamp to tension the mask 1200. Alternatively, the second region AR2 may be a region fixed by an adhesive chuck or an electrostatic chuck to tension the mask 1200. According to some embodiments, after the mask 1200 is fixed to the mask frame 1100, the second region AR2 of the mask 1200 may be cut and removed.

The third region AR3 may be arranged between the first region AR1 and the second region AR2 and be a region where the mask 1200 is connected to the mask frame 1100. As an example, the third region AR3 may be fixed and connected to the first sub-frame 1110 or the second sub-frame 1120 of the mask frame 1100 through welding.

According to some embodiments, the mask 1200 may include the deposition pattern portion AP and a dummy pattern portion DP arranged in the first region AR1. At least the deposition pattern portion AP of the mask 1200 may be arranged to overlap the opening 1150 of the mask frame 1100. The deposition pattern portion AP of the mask 1200 may include a plurality of deposition holes AH that enable the deposition material to pass through them. Accordingly, during a deposition process, the deposition material may pass through the opening 1150 of the mask frame 1100 and the deposition holes AH of the mask 1200, and then reach the display substrate DS. Through this, the deposition material may be deposited in only a preset region of the display substrate DS that corresponds to the deposition holes AH.

According to some embodiments, the deposition pattern portion AP may be provided in a plurality. The plurality of deposition pattern portions AP may be apart from each other with a preset interval and, for example, be apart from each other in the longitudinal direction (that is, the x-direction) of the mask 1200. The plurality of deposition pattern portions AP may include a first deposition pattern portion AP1, a second deposition pattern portion AP2, . . . , and an n-th deposition pattern portion APn. Here, n is a natural number.

As shown in FIG. 3, though the deposition pattern portion AP may have a quadrangular shape in a plan view, the embodiments are not limited thereto. As an example, the deposition pattern portion AP may have various shapes such as a polygon including a triangle, a pentagon and the like, a circular shape, an elliptical shape and the like. As an example, the deposition pattern portion AP may correspond to the shape of a display area DA (see FIG. 11) of the display apparatus 2 (see FIG. 11) described below.

The dummy pattern portion DP may be arranged outside the deposition pattern portion AP. According to some embodiments, the dummy pattern portion DP may be arranged to surround the deposition pattern portion AP entirely in a plan view. As described above, in the case where the deposition pattern portion AP is provided in a plurality, the dummy pattern portions DP may be arranged to surround each deposition pattern portion AP entirely. According to some embodiments, the dummy pattern portion DP may contact the deposition pattern portion AP in a plan view.

Though it is shown in FIG. 3 that the width of the dummy pattern portion DP in the y-direction is less than an interval between the edge of the deposition pattern portion AP and the edge of the mask 1200, the embodiments are not limited thereto and the width of the dummy pattern portion DP in the y-direction may be variously changed. As an example, the width of the dummy pattern portion DP in the y-direction may be the same as an interval between the edge of the deposition pattern portion AP and the edge of the mask 1200 In this case, it may be understood that the edge of the dummy pattern portion DP coincides with the edge of the mask 1200 in a plan view.

The dummy pattern portion DP may include an auxetic structure and include a plurality of dummy holes DH for this. Detailed descriptions thereof are made below with reference to FIGS. 4 and 5.

Figure 4:
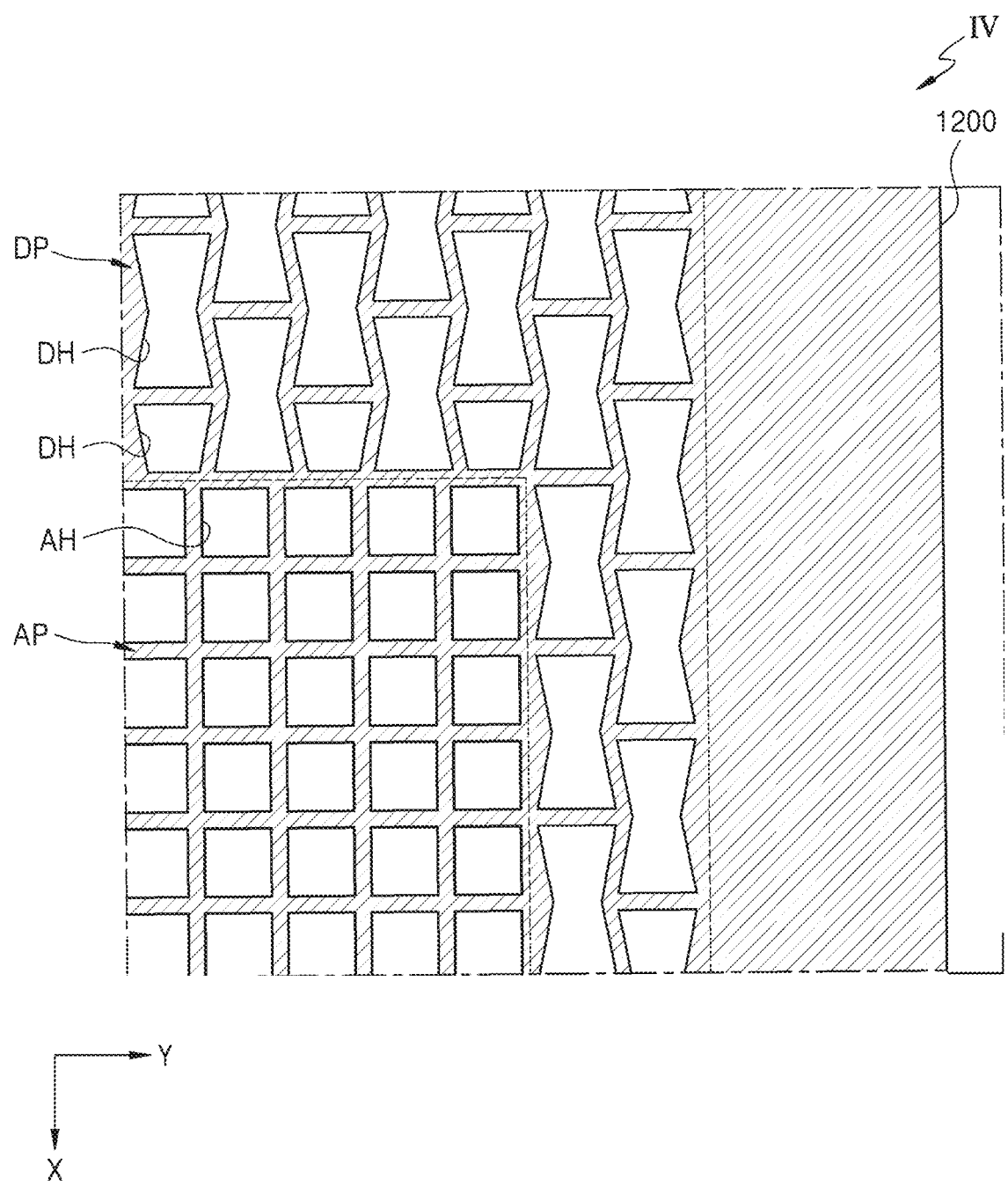
FIG. 4 is an enlarged plan view of a portion of a mask provided in an apparatus for manufacturing a display apparatus, according to some embodiments.
Figure 5:
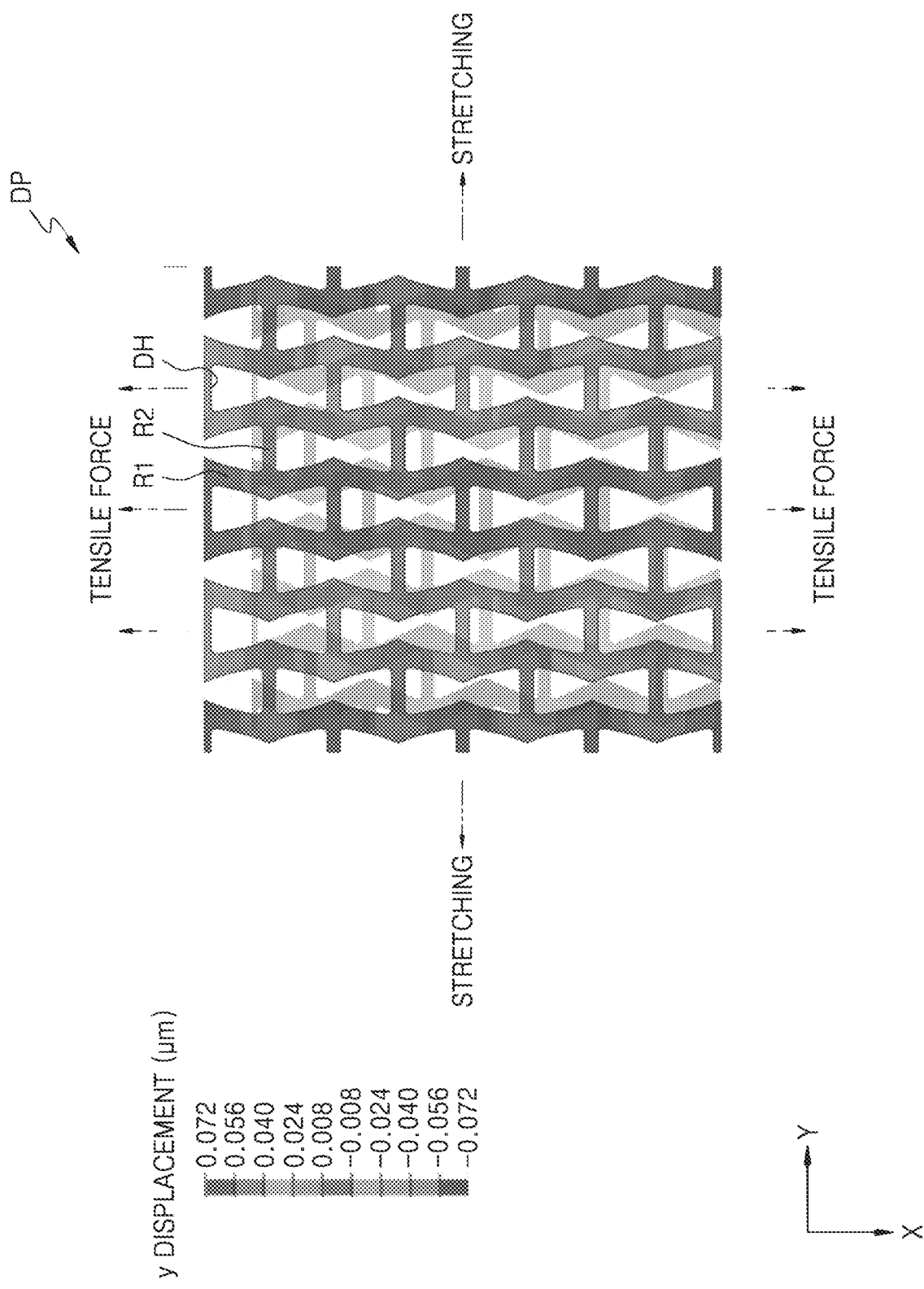
FIG. 5 is an image showing a structure of a dummy pattern portion provided in a mask, according to some embodiments.

FIG. 4 is an enlarged plan view of a portion of a mask provided to an apparatus for manufacturing a display apparatus according to some embodiments and may correspond to a region IV of the mask of FIG. 3. FIG. 5 is an image showing a structure of a dummy pattern portion provided to a mask according to some embodiments. FIG. 5 shows a displacement in a transversal direction of the dummy pattern portion in the case where tensile force is applied in a longitudinal direction.

Referring to FIG. 4, the deposition pattern portion AP of the mask 1200 may include a plurality of deposition holes AH. The plurality of deposition holes AH may be through holes that pass the deposition material such that the deposition material is deposited in only a region (that is, a deposition region) defined in advance. Accordingly, each deposition hole AH may have a shape corresponding to the deposition region. As an example, the deposition hole AH may have a quadrangular shape in a plan view. Alternatively, the deposition hole AH may have various shapes such as a polygon including a triangle, a pentagon and the like, a circular shape, an elliptical shape and the like.

According to some embodiments, the dummy pattern portion DP of the mask 1200 may include an auxetic structure having a negative Poisson's ratio. When longitudinal tensile force is applied to a member, transformations corresponding to the longitudinal direction and the transversal direction occur. In this case, a ratio of a transformation rate in the longitudinal direction and a transformation rate in the transversal direction is defined as a Poisson's ratio. Because a sign of a transformation rate in the longitudinal direction is different from a sign of a transformation rate in the transversal direction in a general member, the general member has a positive Poisson's ratio. That is, when longitudinal tensile force is applied, stretching in the longitudinal direction and contraction in the transversal direction occur.

In contrast, in the case where a member includes an auxetic structure, unlike a general member, a sign of a transformation rate in the longitudinal direction may be the same as a sign of a transformation rate in the transversal direction. That is, the auxetic structure has a negative Poisson's ratio. When longitudinal tensile force is applied to a member including an auxetic structure, stretching may occur in the transversal direction as well as the longitudinal direction.

Referring to FIG. 5, in the case where tensile force in the longitudinal direction (that is, the ±x-direction) is applied to the dummy pattern portion DP having the auxetic structure, transformation in the transversal direction (that is, a ±y-direction) occurs. Specifically, when the tensile force in the ±x-direction is applied, the left portion of the dummy pattern portion DP is displaced in the (−) y-direction, and the right portion is displaced in the +y-direction, and thus, the dummy pattern portion DP is stretched in the ±y-direction as a whole. The auxetic structure of the dummy pattern portion DP may be originated from the plurality of dummy holes DH provided in the dummy pattern portion DP.

According to some embodiments, the dummy pattern portion DP of the mask 1200 may include a plurality of dummy holes DH having a shape different from that of the plurality of deposition holes AH of the deposition pattern portion AP in a plan view. As an example, each dummy hole DH may have an hourglass shape as shown in FIGS. 4 and 5. That is, each dummy hole DH may have a shape in which an approximately isosceles trapezoidal shape and an inverse isosceles trapezoidal shape meet at one edge. In addition, a portion of the dummy hole DH may have an inverse isosceles trapezoidal shape depending on a position thereof.

It may be understood that the dummy hole DH is formed by a first rib R1 and a second rib R2 crossing each other. The first rib R1 may extend in the x-direction on the whole and extend in zigzags. That is, the first rib R1 may include a first part and a second part that form a preset angle and the first parts and the second parts may be alternately arranged in the x-direction. The second rib R2 may extend in the y-direction.

When tensile force in the ±x-direction is applied to the dummy pattern portion DP, the first rib R1 tends to stretch to be a straight line. That is, an angle between the first part and the second part of the first rib R1 may be changed. Accordingly, the second rib R2 may be displaced in the ±y-direction. As a result of this operation, the dummy pattern portion DP has an auxetic structure on the whole.

Figure 6A:
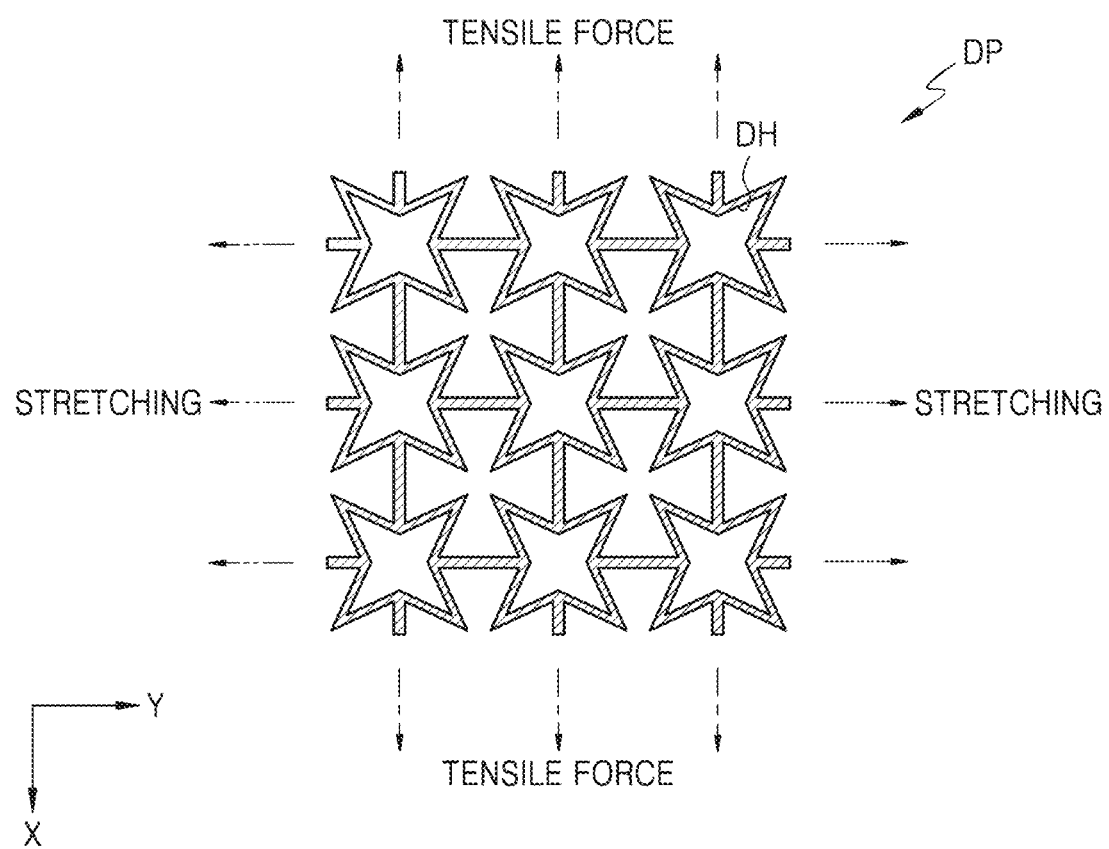
FIGS. 6A and 6B are enlarged plan views of a structure of a dummy pattern portion provided in a mask, according to some embodiments.
Figure 6B:
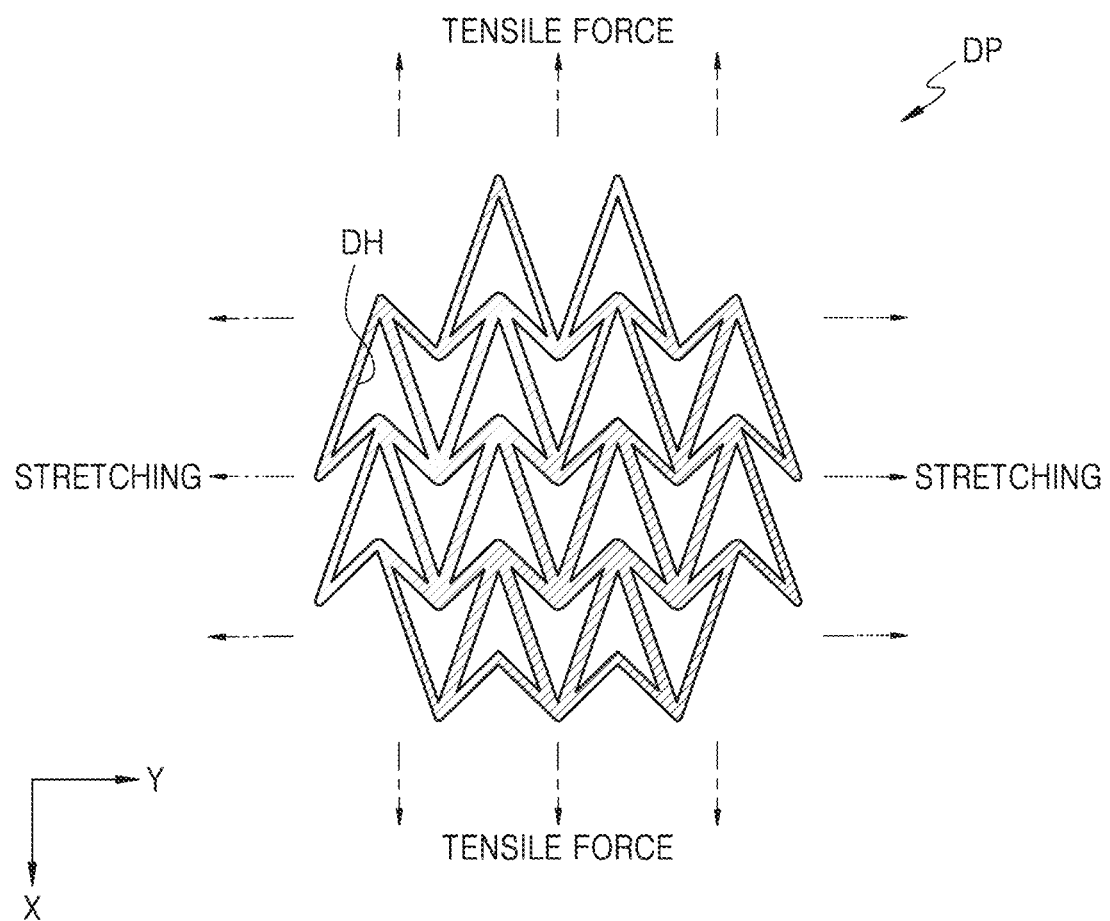

FIGS. 6A and 6B are enlarged plan views of a structure of the dummy pattern portion DP provided to a mask according to some embodiments.

Referring to FIGS. 6A and 6B, the dummy hole DH of the dummy pattern portion DP may be formed by ribs extending in various directions. The ribs crossing each other may have a preset angle. Similar to the dummy pattern portion DP of FIG. 5, when tensile force in the ±x-direction is applied to the dummy pattern portion DP, an angle between the ribs crossing each other is changed. Accordingly, some of the ribs may be displaced in the ±y-direction. As a result of this operation, the dummy pattern portion DP has an auxetic structure on the whole.

The auxetic structure of the dummy pattern portion DP shown in FIGS. 6A and 6B is provided as an example and the embodiments according to the present disclosure are not limited thereto. As far as a structure having a negative Poisson' ratio, any structure may be employed.

Figure 7A:
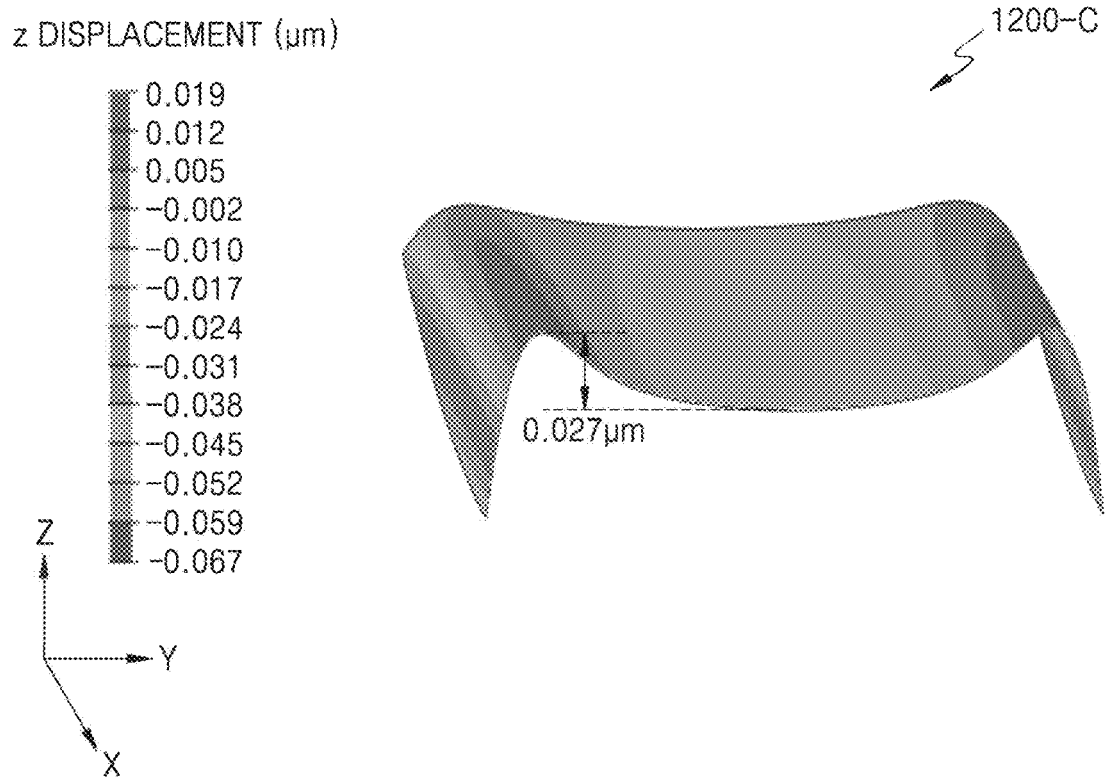
FIGS. 7A and 7B are images showing transformation of a mask when tensile force is applied to the mask, according to a comparative example.
Figure 7B:
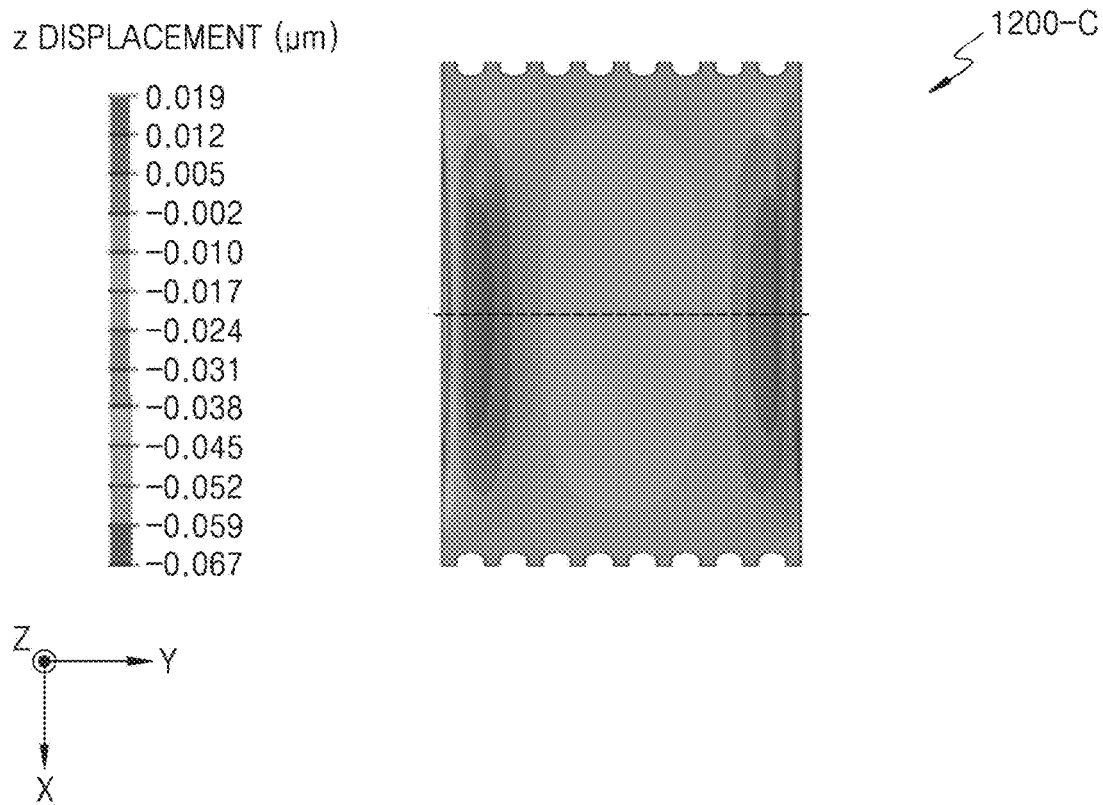
Figure 8A:
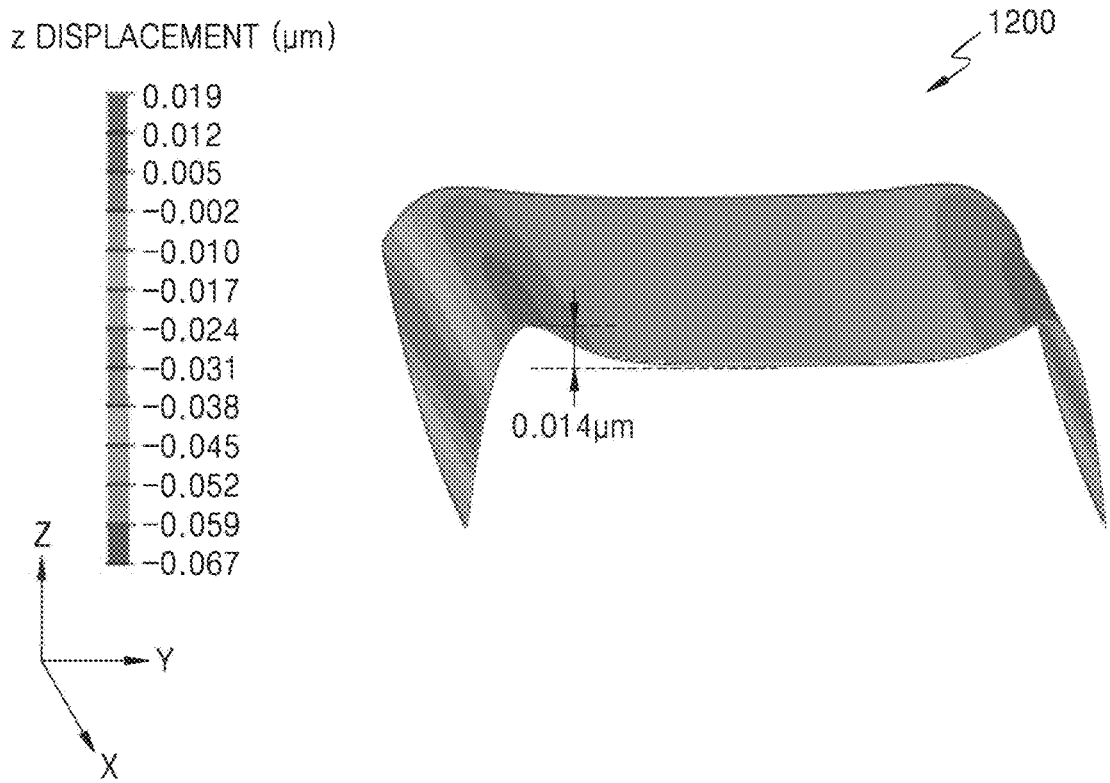
FIGS. 8A and 8B are images showing transformation of a mask when tensile force is applied to the mask, according to some embodiments.
Figure 8B:
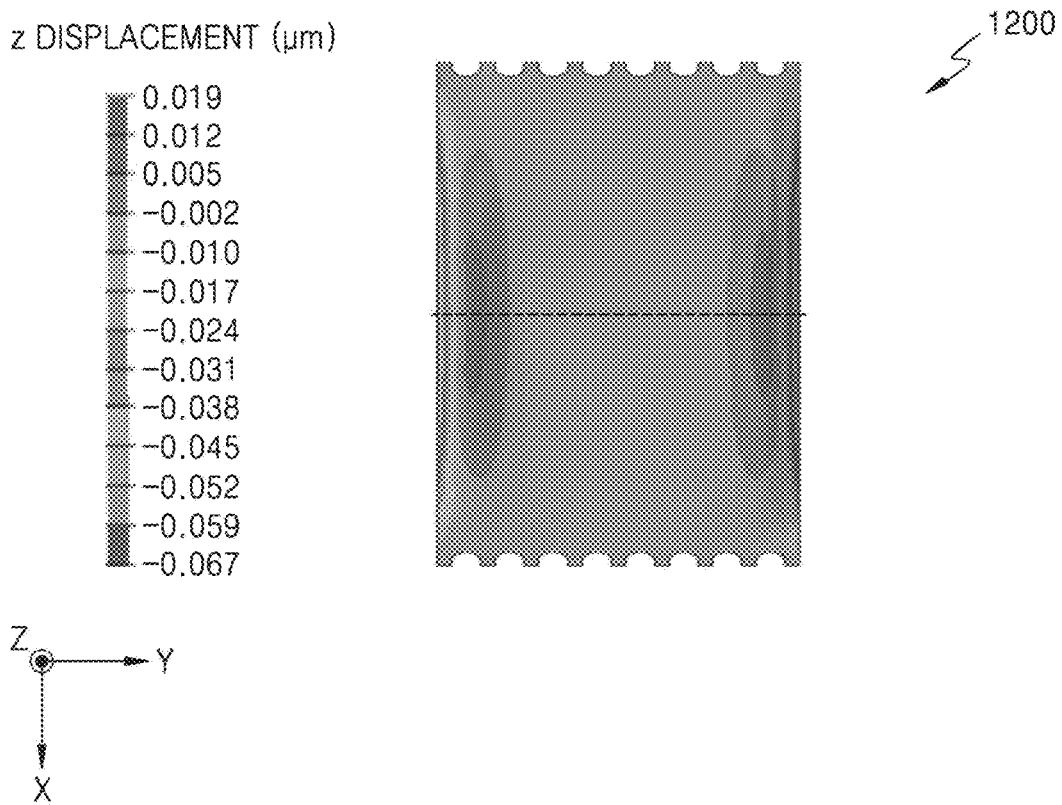

FIGS. 7A and 7B are images showing transformation of a mask when tensile force is applied to the mask according to a comparative example. FIGS. 8A and 8B are images showing transformation of a mask when tensile force is applied to the mask according to some embodiments. FIGS. 7A, 7B, 8A, and 8B show simulation results performed under the same condition.

Referring to FIGS. 7A and 7B, a mask 1200-C according to a comparative example does not include an auxetic structure. Generally, the mask 1200-C may have a very thin thickness compared to a length thereof and/or a width thereof. Accordingly, when the mask 1200-C is stretched in one direction (e.g., the ±x-direction), curls and/or wrinkles may unexpectedly be formed on the mask 1200-C according to inner stress. The curls and wrinkles may mean that the mask 1200-C is partially (e.g., only partially) displaced in a thickness direction (e.g., the ±z-direction) perpendicular to the tension direction (e.g., the ±x-direction).

As described above, the curls formed on the mask 1200-C may hinder the mask 1200-C from being accurately aligned and attached to the mask frame 1100 (see FIG. 2). In addition, the wrinkles formed on the mask 1200-C may hinder the mask 1200-C from being closely attached to the mask frame 1100. Deposition defects may occur when the mask assembly 1000 (see FIG. 2) including the mask 1200-C is used.

Referring to FIGS. 8A and 8B, because the mask 1200 according to some embodiments includes the auxetic structure, the occurrence of the curls and wrinkles may be reduced. In the mask 1200 according to the comparative example in FIG. 7A, the amount of maximum displacement is about 0.027 μm. In contrast, in the mask 1200 of FIG. 8A, the amount of maximum displacement is about 0.014 μm. That is, according to some embodiments, while the mask 1200 is stretched, it is revealed that the amount of maximum displacement of the mask 1200 in the z-direction is reduced by about 48.3% compared to the comparative example.

As described above, because the forming of the curls and wrinkles on the mask 1200 is reduced, the mask assembly 1000 and the apparatus 1 for manufacturing a display apparatus in which precise deposition may be made may be provided eventually.

Figure 9:
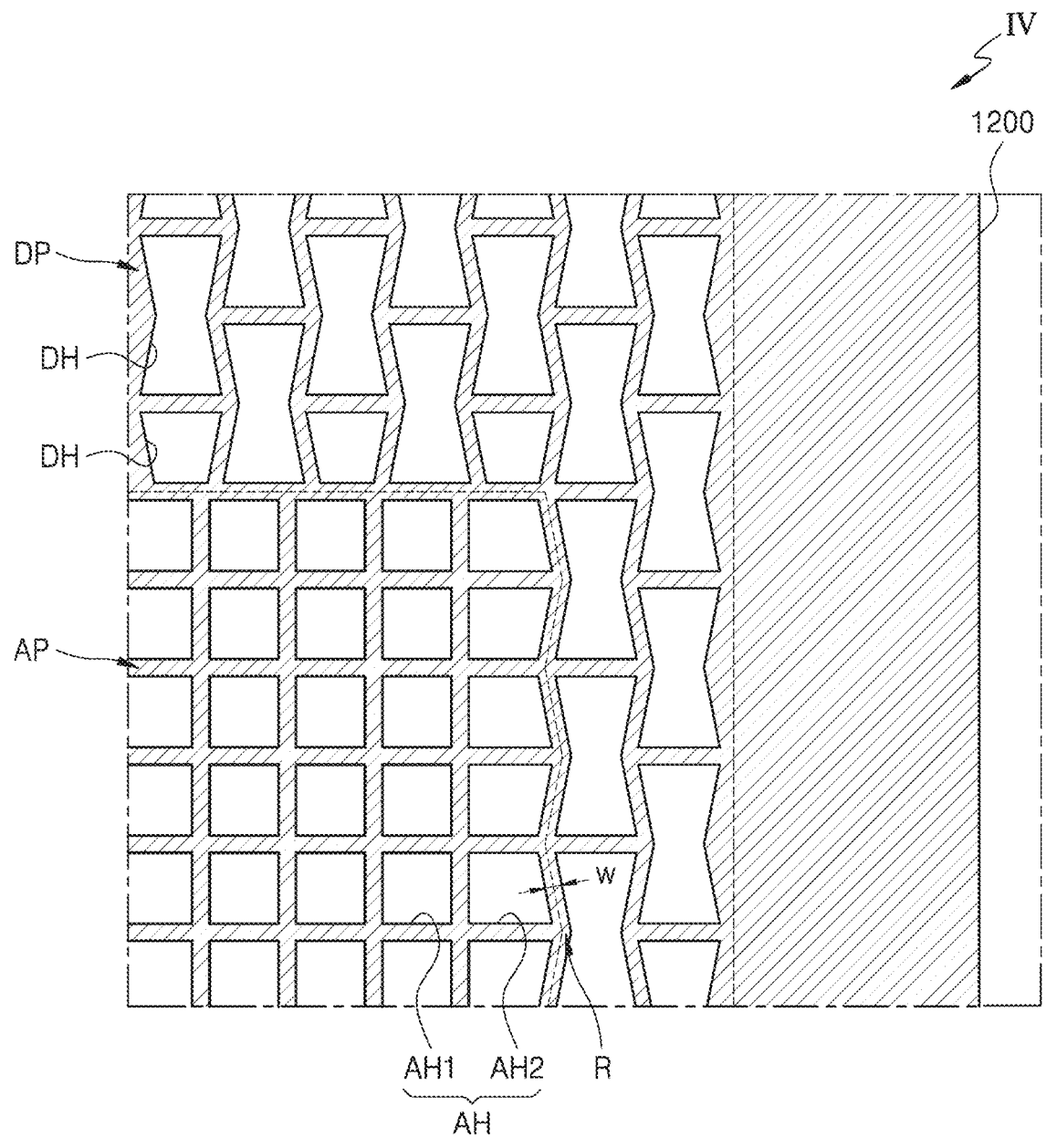
FIG. 9 is an enlarged plan view of a portion of a mask provided in an apparatus for manufacturing a display apparatus, according to some embodiments.

FIG. 9 is an enlarged plan view of a portion of a mask provided to an apparatus for manufacturing a display apparatus according to some embodiments. Contents repeated in the contents described above with reference to FIG. 4 are omitted and differences are mainly described below.

Referring to FIG. 9, the deposition pattern portion AP of the mask 1200 may include a first deposition hole AH and a second deposition hole AH having different planar shapes.

According to some embodiments, the second deposition hole AH may be adjacent to one of the plurality of dummy holes DH. As an example, the second deposition hole AH may be arranged on the outermost portion of the deposition pattern portion AP. The second deposition hole AH may be provided in a plurality. The plurality of second deposition holes AH may be arranged along the edge of the deposition pattern portion AP in the outermost portion of the deposition pattern portion AP. Because the deposition pattern portion AP contacts the dummy pattern portion DP in a plan view, the second deposition hole AH may be adjacent to one of the dummy holes DH.

According to some embodiments, the second deposition hole AH may have a shape corresponding to the shape of one of the dummy holes DH such that a width w between the second deposition hole AH and one of the dummy holes DH is constant in a plan view. That is, the width w between the second deposition hole AH and the dummy hole DH that are adjacent to each other may be constant.

Through the shape and the configuration of the second deposition holes AH, the thickness of a rib R forming the dummy hole DH of the dummy pattern portion DP may be formed uniform near the boundary between the dummy pattern portion DP and the deposition pattern portion AP. Through this, a more uniform and better auxetic structure of the dummy pattern portion DP may be formed, and thus, curls and/or wrinkles that may be formed on the mask 1200 may be reduced.

Figure 10:
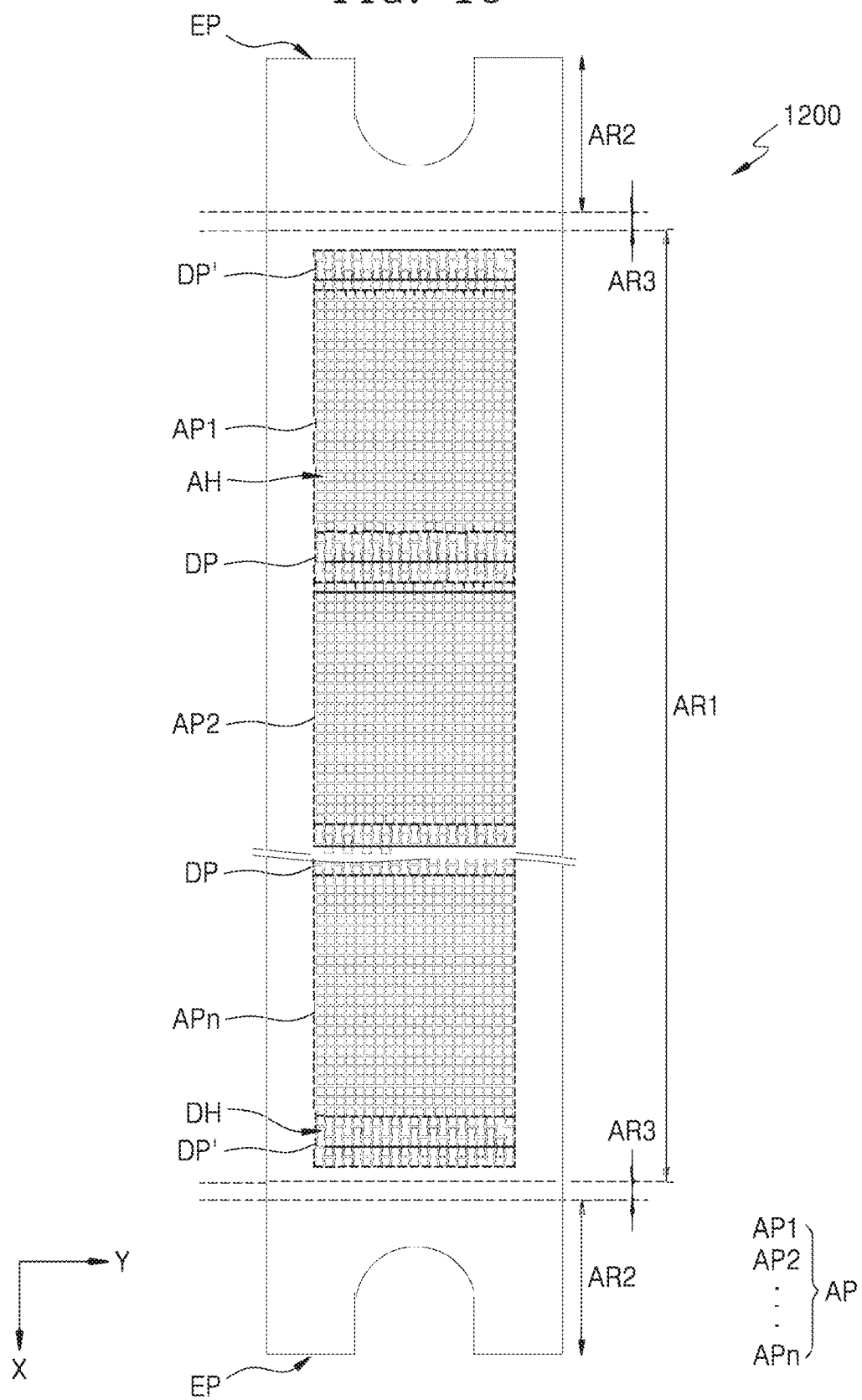
FIG. 10 is a plan view of a mask according to some embodiments.

FIG. 10 is a plan view of the mask 1200 according to some embodiments. Contents repeated in the contents described above with reference to FIG. 3 are omitted and differences are mainly described below.

Referring to FIG. 10, the dummy pattern portion DP of the mask 1200 may partially (e.g., only partially and not entirely) surround the deposition pattern portion AP in a plan view. According to some embodiments, the dummy pattern portion DP may be arranged between the deposition pattern portions AP that are adjacent to each other. That is, the dummy pattern portion DP may be arranged in a separation region between the deposition pattern portions AP that are adjacent to each other. Through this, the occupying region of the dummy pattern portion DP may be reduced to increase the occupying region of the deposition pattern portion AP, and simultaneously, the occurrence of the curls and the wrinkles may be reduced. This configuration is made considering that the mask 1200 is vulnerable to the occurrence of the curls and the wrinkles of the mask 1200 away from the third region AR3 of the mask 1200 or toward the central region of the mask 1200.

According to some embodiments, a dummy pattern portion DP' of the mask 1200 may be arranged between an end portion EP crossing the longitudinal direction (e.g., the x-direction) of the mask 1200 and the deposition pattern portion AP. In this case, the dummy pattern portion DP' may have a rectangular shape extending in a transversal direction (the y-direction) crossing the longitudinal direction (e.g., the x-direction) of the mask 1200 in a plan view. According to some embodiments, the dummy pattern portion DP' may be arranged in the first region AR1 and be adjacent to the outside of the deposition pattern portion AP. As an example, the dummy pattern portion DP' may be adjacent to one side of the first deposition pattern portion AP1 or an n-th deposition pattern portion APn that is closest to the two opposite ends EP of the mask 1200 among the deposition pattern portions AP. According to some embodiments, the dummy pattern portion DP' may be arranged in also the second region AR2 and/or the third region AR3 according to some embodiments.

Figure 11:
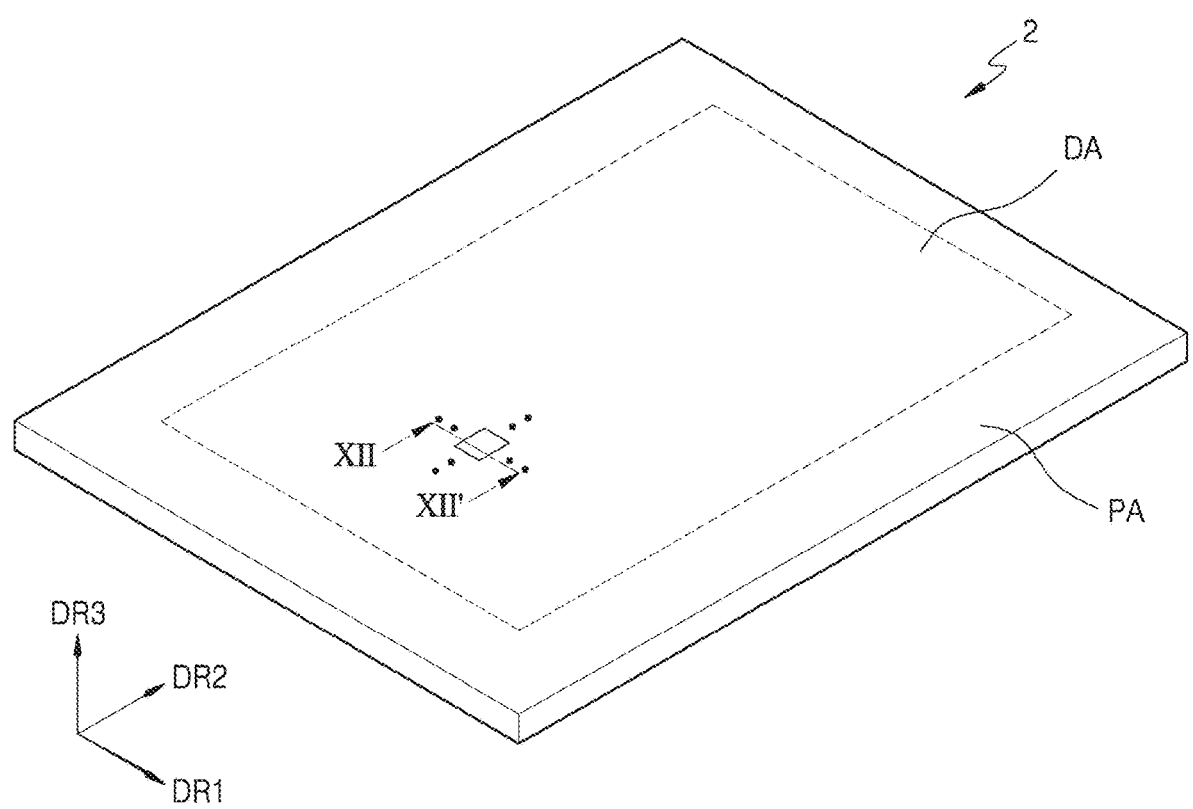
FIG. 11 is a plan view of a display apparatus manufactured by using an apparatus for manufacturing a display apparatus, according to some embodiments.

FIG. 11 is a plan view of a display apparatus 2 manufactured through an apparatus for manufacturing a display apparatus according to some embodiments.

Referring to FIG. 11, the display apparatus 2 may include a display area DA and a peripheral area PA outside the display area DA. The display apparatus 2 may display an image through an array of a plurality of pixels PX two-dimensionally arranged in the display area DA.

The pixel PX may be defined as a region in which a light-emitting element arranged in the display area DA emits light. Each pixel PX may be configured to emit light having a preset color. As an example, the pixel PX may be configured to emit red, green, or blue light or emit red, green, blue, or white light. In addition, a pixel circuit may be arranged in the display area DA, the pixel circuit driving a light-emitting element.

The peripheral area PA is a region in which an image is not displayed and may surround the display area DA entirely or partially (e.g., only partially and not entirely). A driver, wirings and the like may be arranged in the peripheral area PA, the driver, the wirings, and the like providing electric signals or power to the pixel circuit. A pad portion may be arranged in the peripheral area PA, electronic elements or a printed circuit board and the like being electrically connected to the pad portion.

The display apparatus 2 may be used as a display screen of various products including televisions, notebook computers, monitors, advertisement boards, Internet of things (IoT) as well as portable electronic apparatuses including mobile phones, smart phones, tablet personal computers (PC), mobile communication terminals, electronic organizers, electronic books, portable multimedia players (PMP), navigations, and ultra mobile personal computers (UMPC). In addition, the display apparatus 2 according to some embodiments may be used in wearable devices including smartwatches, watchphones, glasses-type displays, and head-mounted displays (HMD). In addition, the display apparatus 2 according to some embodiments may be used as instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

Figure 12:
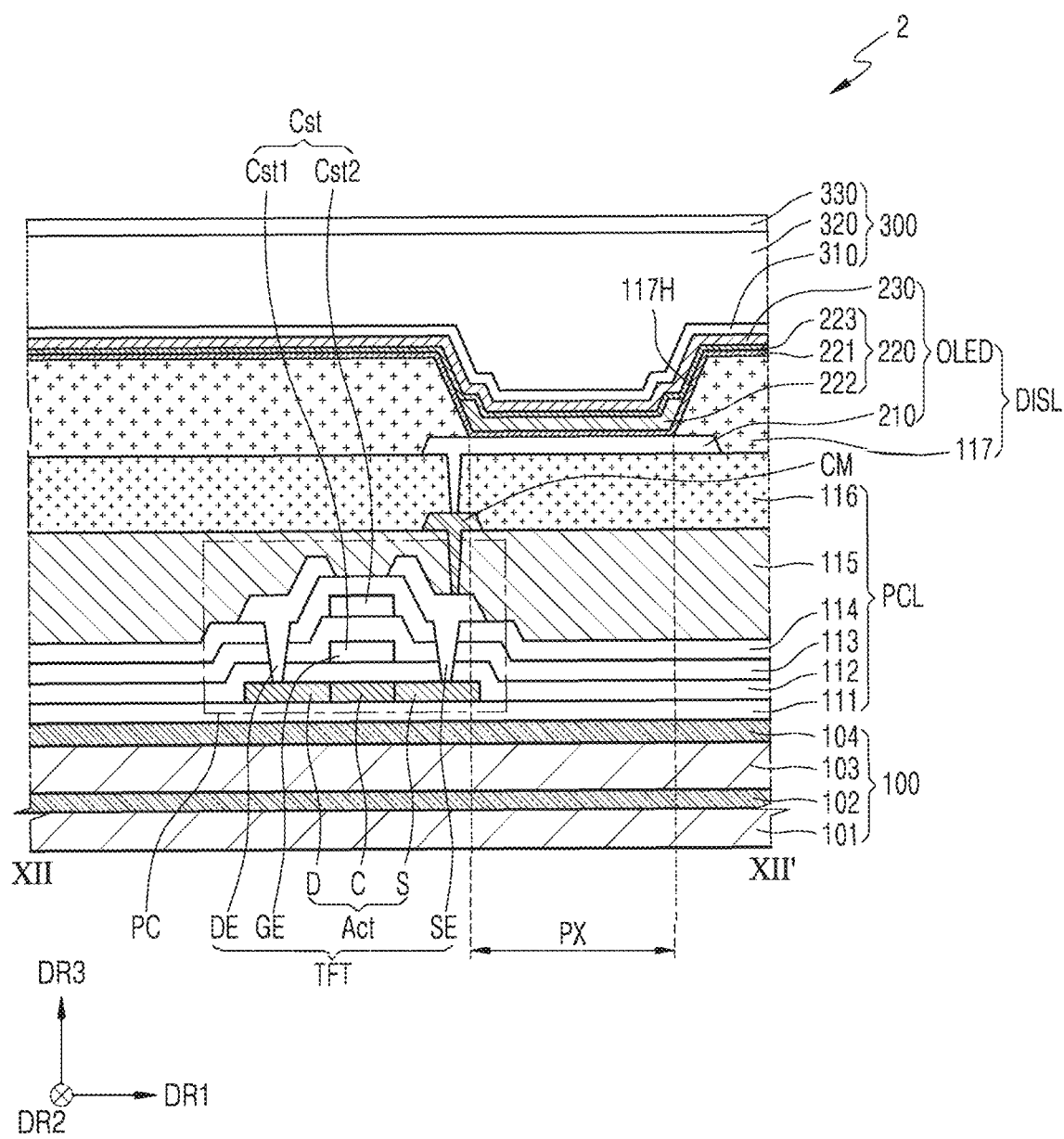
FIG. 12 is a cross-sectional view of a display apparatus manufactured by using an apparatus for manufacturing a display apparatus, according to some embodiments.

FIG. 12 is a cross-sectional view of a display apparatus manufactured through an apparatus for manufacturing a display apparatus according to some embodiments and may correspond to a cross-section of the display apparatus, taken along the line XII-XII' of FIG. 11.

Referring to FIG. 12, the display apparatus 12 may include a stack structure of a substrate 100, a pixel circuit layer PCL, a display layer DISL, and an encapsulation layer 300.

The substrate 100 may have a multi-layered structure including a base layer and an inorganic layer, the base layer including a polymer resin. As an example, the substrate 100 may include a base layer and a barrier layer of an inorganic insulating layer, the base layer including a polymer resin. As an example, the substrate 100 may include a first base layer 101, a first barrier layer 102, a second base layer 103, and a second barrier layer 104 that are sequentially stacked. The first base layer 101 and the second base layer 103 may include a polymer resin such as polyimide (PI), polyethersulfone (PES), polyacrylate, polyetherimide (PEI), polyethylene naphthalate (PEN), polyethylene terephthalate (PET), polyphenylene sulfide (PPS), polycarbonate (PC), cellulose tri acetate (TAC), and/or cellulose acetate propionate (CAP). The first barrier layer 102 and the second barrier layer 104 may include an inorganic insulating material such as silicon oxide, silicon oxynitride, and/or silicon nitride. The substrate 100 may be flexible.

The pixel circuit layer PCL may be arranged on the substrate 100. The pixel circuit layer PCL may include a pixel circuit PC. FIG. 12 shows a cross-section of a portion of the pixel circuit PC as an example. The pixel circuit PC may include at least one thin-film transistor TFT and at least one storage capacitor Cst. The pixel circuit layer PCL may include not only the pixel circuit PC but also a buffer layer 111, a first gate insulating layer 112, a second gate insulating layer 113, an interlayer insulating layer 114, a first planarization layer 115, and a second planarization layer 116 under and/or on respective elements constituting the pixel circuit PC.

The buffer layer 111 may reduce or block the penetration of foreign substance, moisture, or external air from below the substrate 100 and provide a flat surface on the substrate 100. The buffer layer 111 may include an inorganic insulating material such as silicon oxide, silicon oxynitride, and/or silicon nitride and include a single-layered structure or a multi-layered structure including the above materials.

A thin-film transistor TFT on the buffer layer 111 may include a semiconductor layer Act including polycrystalline silicon. Alternatively, the semiconductor layer Act may include amorphous silicon, an oxide semiconductor, or an organic semiconductor. The semiconductor Act may include a channel region C, a drain region D, and a source region S, the drain region D and the source region S being arranged on two opposite sides of the channel region C. A gate electrode GE may overlap the channel region C.

The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The first gate insulating layer 112 between the semiconductor layer Act and the gate electrode GE may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode GE. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode Cst2 of the storage capacitor Cst may be arranged on the second gate insulating layer 113. The upper electrode Cst2 may overlap the gate electrode GE therebelow. In this case, the gate electrode GE and the upper electrode Cst2 overlapping each other with the second gate insulating layer 113 therebetween may constitute the storage capacitor Cst. That is, the gate electrode GE may serve as a lower electrode Cst1 of the storage capacitor Cst.

As described above, the storage capacitor Cst may overlap the thin-film transistor TFT. According to some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the inorganic insulating materials.

A drain electrode DE and a source electrode SE may be arranged on the interlayer insulating layer 114. The drain electrode DE and the source electrode SE may be respectively connected to the drain region D and the source region S through contact holes formed in the insulating layers thereunder. The drain electrode DE and the source electrode SE may include a material having excellent conductivity. The drain electrode DE and the source electrode SE may include a conductive material including molybdenum (Mo), aluminum (Al), copper (Cu), and titanium (Ti) and have a single-layered structure or a multi-layered structure including the above materials. According to some embodiments, the drain electrode DE and the source electrode SE may have a multi-layered structure of Ti/Al/Ti.

The first planarization insulating layer 115 may cover the drain electrode DE and the source electrode SE. A contact metal CM may be arranged on the first planarization insulating layer 115. The contact metal CM may include a conductive material including molybdenum (Mo), aluminum (Al), copper (Cu), and titanium (Ti) and have a single-layered structure or a multi-layered structure including the above materials. The second planarization insulating layer 116 may be arranged on the first planarization insulating layer 115 and may cover the contact metal CM.

The first planarization insulating layer 115 and the second planarization insulating layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display layer DISL may be arranged on the pixel circuit layer PCL. The display layer DISL may include an organic light-emitting diode OLED as a light-emitting element. The organic light-emitting diode OLED may include a stack structure of a pixel electrode 210, an intermediate layer 220, and an opposite electrode 230. The organic light-emitting diode OLED may emit, for example, red, green, or blue light, or emit red, green, blue, or white light. The organic light-emitting diode OLED emits light through an emission region. The emission region may be defined as a pixel PX.

The pixel electrode 210 of the organic light-emitting diode OLED may be electrically connected to the thin-film transistor TFT through contact holes formed in the second planarization insulating layer 116 and the first planarization insulating layer 115, and the contact metal CM on the first planarization insulating layer 115.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the pixel electrode 210 may further include a layer on/under the reflective layer, the layer including ITO, IZO, ZnO, or $In_2O_3$.

A pixel-defining layer 117 may be arranged on the pixel electrode 210, the pixel-defining layer 117 including a hole 117H that exposes the central portion of the pixel electrode 210. The pixel-defining layer 117 may include an organic insulating material and/or an inorganic insulating material. The hole 117H may define an emission region of light emitted from the organic light-emitting diode OLED. As an example, the size/the width of the hole 117H may correspond to the size/the width of the emission region. Accordingly, the size and/or the width of the pixel PX may depend on the size and/or the width of the hole 117H of the pixel-defining layer 117.

The intermediate layer 220 may include an emission layer 222 formed to correspond to the pixel electrode 210. The emission layer 222 may include a polymer organic material or a low-molecular weight organic material that emits light of a preset color. Alternatively, the emission layer 222 may include an inorganic light-emitting material or quantum dots.

According to some embodiments, the intermediate layer 220 may include a first functional layer 221 and a second functional layer 223 respectively arranged under and on the emission layer 222. The first functional layer 221 may include, for example, a hole transport layer (HTL) or include an HTL and a hole injection layer (HIL). The second functional layer 223 is an element arranged on the emission layer 222 and may include an electron transport layer (ETL) and/or an electron injection layer (EIL). Like the opposite electrode 230 described below, the first functional layer 221 and/or the second functional layer 223 may be a common layer formed to cover the substrate 100 entirely.

The opposite electrode 230 may be arranged over the pixel electrode 210 and may overlap the pixel electrode 210. The opposite electrode 230 may include a conductive material having a small work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may further include a layer on the (semi)

transparent layer, the layer including ITO, IZO, ZnO, or $In_2O_3$. The opposite electrode 230 may be formed as one body to cover the substrate 100 entirely.

The encapsulation layer 300 may be arranged on the display layer DISL and may cover the display layer DISL. The encapsulation layer 300 includes at least one inorganic encapsulation layer and at least one organic encapsulation layer. According to some embodiments, it is shown in FIG. 12 that the encapsulation layer 300 includes a first inorganic encapsulation layer 310, an organic encapsulation layer 320, and a second inorganic encapsulation layer 330.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. According to some embodiments, the organic encapsulation layer 320 may include acrylate. The organic encapsulation layer 320 may be formed by hardening a monomer or coating a polymer. The organic encapsulation layer 320 may be transparent.

According to some embodiments, a preset pattern layer provided to the display apparatus 2 may be precisely formed by using the apparatus 1 for manufacturing a display apparatus shown in FIG. 1. As an example, the apparatus 1 for manufacturing a display apparatus may be used to form the emission layer 222.

Up to now, though description has been made to the case where the display apparatus 2 includes the organic light-emitting diodes OLED as light-emitting elements, the display apparatus 2 according to some embodiments is not limited thereto as long as the display apparatus 2 includes a preset pattern layer including an organic material. According to some embodiments, the display apparatus 2 may be a light-emitting display apparatus including an inorganic light-emitting diode, that is, an inorganic light-emitting display. According to some embodiments, the display apparatus 2 may be a quantum-dot light-emitting display.

According to some embodiments, because a mask includes a dummy pattern portion including an auxetic structure, curls and wrinkles formed on the mask may be reduced while the mask is stretched. An apparatus for manufacturing a display apparatus in which precisely deposition may be performed may be implemented by using a mask assembly that includes the mask. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A mask assembly comprising:
a mask frame including an opening; and
a mask on the mask frame and including a plurality of deposition pattern portions arranged along a first direction and a dummy pattern portion, wherein a deposition pattern portion from among the plurality of deposition pattern portions overlaps the opening, and the dummy pattern portion is outside the deposition pattern portion,
wherein the dummy pattern portion includes an auxetic structure having a negative Poisson's ratio, and is arranged between two adjacent deposition pattern portions from among the plurality of deposition pattern portions,
wherein the dummy pattern portion includes a plurality of dummy holes,
wherein the deposition pattern portions include a first deposition hole and a second deposition hole having different planar shapes from each other, and the second deposition hole is adjacent to one of the plurality of dummy holes of the dummy pattern portion in the first direction, and
wherein the second deposition hole has a shape corresponding to a shape of one of the plurality of dummy holes such that a width between the second deposition hole and the one of the plurality of dummy holes is constant in a plan view.

2. The mask assembly of claim 1, wherein
the plurality of dummy holes have shapes different from those of the first deposition hole and the second deposition hole in a plan view.

3. The mask assembly of claim 1, wherein the dummy pattern portion entirely surrounds the deposition pattern portion in a plan view.

4. The mask assembly of claim 1, wherein the dummy pattern portion partially surrounds the deposition pattern portion in a plan view.

* * * * *